(12) United States Patent
Sawai et al.

(10) Patent No.: US 6,636,824 B1
(45) Date of Patent: Oct. 21, 2003

(54) METHOD OF AND APPARATUS FOR INSPECTING SEMICONDUCTOR DEVICE

(75) Inventors: Kouetsu Sawai, Tokyo (JP); Masahiko Ikeno, Tokyo (JP); Toshiharu Katayama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/567,029

(22) Filed: May 8, 2000

(30) Foreign Application Priority Data

Nov. 26, 1999 (JP) .......................... P11-335680

(51) Int. Cl.[7] ............................................. G06F 19/00
(52) U.S. Cl. ...................................... 702/117; 324/751
(58) Field of Search ........................... 702/117; 324/751

(56) References Cited

U.S. PATENT DOCUMENTS

| | | | | |
|---|---|---|---|---|
| 5,412,209 A | * | 5/1995 | Otaka et al. ................ | 250/310 |
| 5,539,752 A | * | 7/1996 | Berezin et al. ............... | 702/35 |
| 5,594,245 A | * | 1/1997 | Todokoro et al. ........... | 250/310 |
| 5,699,447 A | * | 12/1997 | Alumot et al. .............. | 382/145 |
| 5,841,893 A | * | 11/1998 | Ishikawa et al. ............ | 348/126 |
| 5,877,498 A | * | 3/1999 | Sugimoto et al. ........... | 250/307 |
| 5,953,579 A | * | 9/1999 | Lee et al. .................... | 250/307 |
| 6,091,249 A | * | 7/2000 | Talbot et al. ................ | 324/750 |
| 6,202,037 B1 | * | 3/2001 | Hattori et al. ............... | 702/182 |
| 6,289,257 B1 | * | 9/2001 | Sekine .......................... | 438/14 |
| 6,317,514 B1 | * | 11/2001 | Reinhorn et al. ........... | 250/224 |
| 6,366,688 B1 | * | 4/2002 | Jun et al. ..................... | 382/145 |

FOREIGN PATENT DOCUMENTS

JP        10-300450        11/1998

* cited by examiner

*Primary Examiner*—John Barlow
*Assistant Examiner*—Aditya Bhat
(74) *Attorney, Agent, or Firm*—Oblon, Spivak, McClelland, Maier & Neustadt, P.C.

(57) ABSTRACT

An apparatus for inspecting a semiconductor device comprises a wafer stage (2), a stage driving unit (3), a charged-particle beam irradiation unit (4), an electronic optical system (11), a charged-particle beam control unit (12), a secondary-electron detection unit (5), an amplifier (7), a secondary-electron intensity comparison unit (8), a database (9) connected to an output of the secondary-electron intensity comparison unit (8), a PC (10) connected to an output of the database (9) and a main control unit (6) connected to the output of the database (9) and an output of the PC (10), whose output is connected to the stage driving unit (3), the charged-particle beam irradiation unit (4) and the charged-particle beam control unit (12). The database (9) stores inspection results and inspection addresses on m inspection regions (15) with strong possibility of having opening failures of contact holes (16) in each of a plurality of semiconductor wafers (1).

13 Claims, 12 Drawing Sheets

METHOD OF AND APPARATUS FOR INSPECTING SEMICONDUCTOR DEVICE

TITLE OF THE INVENTION

Method of and Apparatus for Inspecting Semiconductor Device

BACKGROUND OF THE INVENTION

1. Field of the Invention

The present invention relates to a method of and an apparatus for inspecting a semiconductor device, and more particularly to a method thereof and an apparatus therefor used to inspect whether or not there occurs an opening failure of a contact hole formed in a semiconductor wafer by observing a secondary electron image obtained through irradiation with a charged particle beam.

2. Description of the Background Art

Two methods has been conventionally used to inspect whether a contact hole formed in a semiconductor wafer is opened/not-opened. One of them is shown in a conceptional view of FIG. 16. The method uses a defect inspection device 100 and a charged-particle beam device 101. First, the defect inspection device 100 is used for inspection. After that, the charged-particle beam device 101 inputs defect inspection data D100 therein from the defect inspection device 100 and observes a contact hole which seems to have an opening failure.

In another method, whether a contact hole is opened/not-opened is judged by measuring the hole diameter of the contact hole with a CD-SEM and the like.

The former method in the background art, however, has the following problems; the apparatus necessarily becomes large as a whole since the defect inspection device is needed, and moreover it takes long time to perform the inspection since the defect inspection by the defect inspection device and the observation of the defective portion by the charged-particle beam device are separately performed.

The later method in the background art has a problem of low reliability of inspection as compared with the former method since whether the contact hole is opened/not-opened is judged only by measuring the hole diameter, not by direct inspection on whether the contact hole is actually opened or not.

SUMMARY OF THE INVENTION

The present invention is directed to a method of inspecting a semiconductor device. According to a first aspect of the present invention, in the method, one of semiconductor wafers each provided with a plurality of holes is mounted on a stage as a semiconductor wafer under inspection, and assuming that small regions obtained by sectioning a wafer surface of the semiconductor wafer under inspection into a plurality of regions are defined as inspection regions, each of the inspection regions is irradiated with charged particles from a charged-particle irradiation unit and a secondary electron image obtained by irradiation with the charged particles is observed, to inspect whether or not there occurs an opening failure in the holes inside each of the small regions, and the method of the first aspect comprises the steps of: (a) inputting positional data on at least one specified small region to a control unit, the at least one specified small region being likely to have the opening failure than the others of the small regions in the wafer surface; and (b) inspecting whether or not there occurs the opening failure in the at least one specified small region while the control unit relatively moves the charged-particle irradiation unit and the stage on the basis of the positional data so that the at least one specified small region is irradiated with the charged particles.

According to a second aspect of the present invention, in the method according to the first aspect, the step (a) includes the steps of: (a-1) inputting design data of the semiconductor wafers to an inspection-region determination unit; and (a-2) identifying the at least one specified small region on the basis of the design data by the inspection-region determination unit.

According to a third aspect of the present invention, in the method according to the first aspect, the step (a) includes the steps of: (a-1) inputting a defective distribution in the wafer surface obtained on a plurality of products already manufactured by using chips obtained from the other semiconductor wafers having the same structure as the semiconductor wafer under inspection to an inspection-region determination unit; and (a-2) identifying a specified region in the wafer surface, which is likely to have a defective, on the basis of the defective distribution by the inspection-region determination unit, to determine the small region corresponding to the specified region as the specified small region.

According to a fourth aspect of the present invention, in the method according to any one of the first to third aspects, the at least one specified small region includes a plurality of specified small regions, and the method further comprises the steps of: (c) storing inspection results obtained through the method of inspection into a database; and (d) identifying a failure high-incidence region at which occurrence of the opening failure is found in a plurality of semiconductor wafers among the plurality of specified small regions while the control unit refers to the database, and in the method of the fourth aspect, inspection on whether or not there occurs the opening failure is made only on the failure high-incidence region in the step (b).

According to a fifth aspect of the present invention, in the method of inspecting a semiconductor device, one of semiconductor wafers each provided with a plurality of holes is mounted on a stage as a semiconductor wafer under inspection, and assuming that small regions obtained by sectioning a wafer surface of the semiconductor wafer under inspection into a plurality of regions are defined as inspection regions, each of the inspection regions is irradiated with charged particles from a charged-particle irradiation unit and a secondary electron image obtained by irradiation with the charged particles is observed, to inspect whether or not there occurs an opening failure in the holes inside each of the small regions, and the method comprises the steps of: (a) storing inspection results obtained through the method of inspection into a database; (b) identifying a failure high-incidence region at which occurrence of the opening failure is found in a plurality of semiconductor wafers among the plurality of small regions while a control unit refers to the database; and (c) inspecting whether or not there occurs the opening failure in the failure high-incidence region while the control unit relatively moves the charged-particle irradiation unit and the stage so that the failure high-incidence region is irradiated with the charged particles in the semiconductor wafer under inspection.

According to a sixth aspect of the present invention, in the method according to any one of the first to fifth aspects, the plurality of holes include a plurality of the holes belonging to a first group and a plurality of the holes belonging to a second group which are different from each other in intensity of secondary electrons generated from surfaces of the holes by irradiation with the charged particles even when there occurs no opening failure, and the step (b) includes the steps of: (b-1) grouping the plurality of holes included in the at least one specified small region into the holes belonging to the first group and the holes belonging to the second group; (b-2) inspecting whether or not there occurs the opening failure in the holes belonging to the first group; and (b-3) inspecting whether or not there occurs the opening failure in the holes belonging to the second group, the step (b-3) being separately performed from the step (b-2).

The present invention is also directed to an apparatus for inspecting a semiconductor device. According to a seventh aspect of the present invention, the apparatus comprises: a stage on which one of semiconductor wafers each provided with a plurality of holes is mounted as a semiconductor wafer under inspection; a charged-particle irradiation unit for irradiating one of inspection regions with charged particles, the inspection regions being small regions obtained by sectioning a wafer surface of the semiconductor wafer under inspection into a plurality of regions; a failure judgment unit for judging whether or not there occurs an opening failure in the holes inside each of the small regions by observing a secondary electron image obtained by irradiation with the charged particles; and a control unit for relatively moving the charged-particle irradiation unit and the stage on the basis of positional data on a specified small region which is more likely to have the opening failure than the others of the small regions in the wafer surface so that the specified small region is irradiated with the charged particles.

According to an eighth aspect of the present invention, the apparatus according to the seventh aspect further comprises an inspection-region determination unit for identifying the specified small region on the basis of design data on the semiconductor wafer under inspection.

According to a ninth aspect of the present invention, the apparatus according to the seventh aspect further comprises an inspection-region determination unit for identifying a specified region in the wafer surface, which is likely to have a defective, on the basis of a defective distribution in the wafer surface obtained on a plurality of products already manufactured by using chips obtained from the other semiconductor wafers having the same structure as the semiconductor wafer under inspection, to determine the small region corresponding to the specified region as the specified small region.

According to a tenth aspect of the present invention, the apparatus according to any one of the seventh to ninth aspects further comprises a database storing inspection results obtained by using the apparatus for inspection, which can be referred to by the control unit.

According to an eleventh aspect of the present invention, the apparatus for inspecting a semiconductor device comprises: a stage on which one of semiconductor wafers each provided with a plurality of holes is mounted as a semiconductor wafer under inspection; a charged-particle irradiation unit for irradiating one of inspection regions with charged particles, the inspection regions being small regions obtained by sectioning a wafer surface of the semiconductor wafer under inspection into a plurality of regions; and a failure judgment unit for judging whether or not there occurs an opening failure in the holes inside each of the small regions by observing a secondary electron image obtained by irradiation with the charged particles, and the apparatus of the eleventh aspect further comprises: a database storing inspection results obtained by using the apparatus for inspection; and a control unit for identifying a failure high-incidence region at which occurrence of the opening failure is found in a plurality of semiconductor wafers among a plurality of small regions by referring to the database and relatively moving the charged-particle irradiation unit and the stage so that the failure high-incidence region is irradiated with the charged particles in the semiconductor wafer under inspection.

According to a twelfth aspect of the present invention, in the apparatus according to any one of the seventh to eleventh aspects, the plurality of holes include a plurality of the holes belonging to a first group and a plurality of the holes belonging to a second group which are different from each other in intensity of secondary electrons generated from surfaces of the holes by irradiation with the charged particles even when there occurs no opening failure, and the failure judgment unit has a hole grouping unit for grouping the plurality of holes included in the specified small region into the holes belonging to the first group and the holes belonging to the second group.

The method of inspecting a semiconductor device of the first aspect of the present invention ensures reduction in time needed for the inspection as compared with the background-art semiconductor-device inspection method using a defect inspection device. Further, the method of the first aspect enhances reliability of the inspection as compared with the background-art semiconductor-device inspection method in which judgment is made on whether or not the contact hole is opened/not-opened only by measuring the hole diameter. Furthermore, since the inspection is made not on all the inspection regions, it is possible to reduce the time needed for the inspection as compared with the inspection method in which the inspection is made on all the inspection regions. Moreover, since the inspection is always performed on the specified small region with strong possibility of having the opening failure of the contact hole, it is possible to efficiently detect occurrence of the opening failure.

In the method of the second aspect of the present invention, to determine the specified small region to be inspected, an operator teaches nothing but the inspection-region determination unit automatically identifies the specified small region on the basis of the design data of the semiconductor wafer under inspection. Therefore, it is possible to achieve automatization of the inspection and ensure uniformization of inspection accuracy.

In the method of the third aspect of the present invention, to determine the specified small region to be inspected, the operator teaches nothing but the inspection-region determination unit automatically determines the specified small region on the basis of the defective distribution. Therefore, it is possible to achieve automatization of the inspection and ensure uniformization of inspection accuracy. Moreover, by referring to the defective distribution obtained on actual products, it is possible to determine the specified small region with consideration to total causes of failure including processing problems as well as the structural problems.

In the method of the fourth aspect of the present invention, after the inspection on a plurality of semiconductor wafers is completed and respective inspection results on the specified small regions are stored in the database, instead of all the specified small regions, only the failure high-incidence regions at each of which occurrence of the opening failure is found in a plurality of semiconductor wafer are inspected. Therefore, it is possible to further reduce the time needed for inspection and further enhance the efficiency of inspection.

In the method of the fifth aspect of the present invention, after the inspection on a plurality of semiconductor wafers is completed and the inspection results thereof are stored in the database, instead of all the specified small regions, only the failure high-incidence regions at each of which occurrence of the opening failure is found in a plurality of semiconductor wafer are inspected. Therefore, it is possible to further reduce the time needed for inspection and further enhance the efficiency of inspection.

In the method of the sixth aspect of the present invention, since the inspection can be made by the group of the holes which are connected to the portions having the same electric capacity, it is possible to avoid an inspection error due to difference in electric capacity.

The apparatus for inspecting a semiconductor device of the seventh aspect of the present invention ensures simplification of constitution and reduction in time needed for the inspection as compared with the background-art semiconductor-device inspection apparatus using a defect inspection device. Further, the apparatus of the seventh aspect enhances reliability of the inspection as compared with the background semiconductor-device inspection apparatus which makes judgment on whether or not the contact hole is opened/not-opened only by measuring the hole diameter. Furthermore, since the inspection is made not on all the inspection regions, it is possible to reduce the time needed for the inspection as compared with the inspection apparatus which makes the inspection on all the inspection regions. Moreover, since the inspection is always performed on the specified small region with strong possibility of having the opening failure of the contact hole, it is possible to efficiently detect occurrence of the opening failure.

In the apparatus of the eighth aspect of the present invention, to determine the specified small region under inspection, an operator teaches nothing but the inspection-region determination unit automatically identifies the specified small region on the basis of the design data of the semiconductor wafer under inspection. Therefore, it is possible to achieve automatization of the inspection and ensure uniformization of inspection accuracy.

In the apparatus of the ninth aspect of the present invention. to determine the specified small region to be inspected, the operator teaches nothing but the inspection-region determination unit automatically identifies the specified small region on the basis of the defective distribution. Therefore, it is possible to achieve automatization of the inspection and ensure uniformization of inspection accuracy. Moreover, by referring to the defective distribution obtained on actual products, it is possible for the inspection-region determination unit to determine the specified small region with consideration to total causes of failure including problems in the process as well as the structural problems.

In the apparatus of the tenth aspect of the present invention, the control unit can identify the failure high-incidence region at which occurrence of opening failure is found in a plurality of semiconductor wafers among the specified small regions by referring the database. Therefore, since only the failure high-incidence regions are inspected, instead of all the specified small regions, after the inspection on a plurality of semiconductor wafers is completed and the inspection results thereof are stored in the database, it is possible to further reduce the time needed for inspection and further enhance the efficiency of inspection.

In the apparatus of the eleventh aspect of the present invention, since only the failure high-incidence regions are inspected, instead of all the specified small regions, after the inspection on a plurality of semiconductor wafers is completed and the inspection results thereof are stored in the database, it is possible to further reduce the time needed for inspection and further enhance the efficiency of inspection.

In the apparatus of the twelfth aspect of the present invention, the inspection on the holes belonging to the first group and the inspection on the holes belonging to the second group can be separately performed, and it is thereby possible to avoid an inspection error due to difference in electric capacity.

An object of the present invention is to provide a method of and an apparatus for inspecting a semiconductor device, with a simpler constitution using no defect inspection device, requiring a short time for inspection and ensuring high reliability in inspecting whether a contact hole formed in a semiconductor wafer is opened/not-opened.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
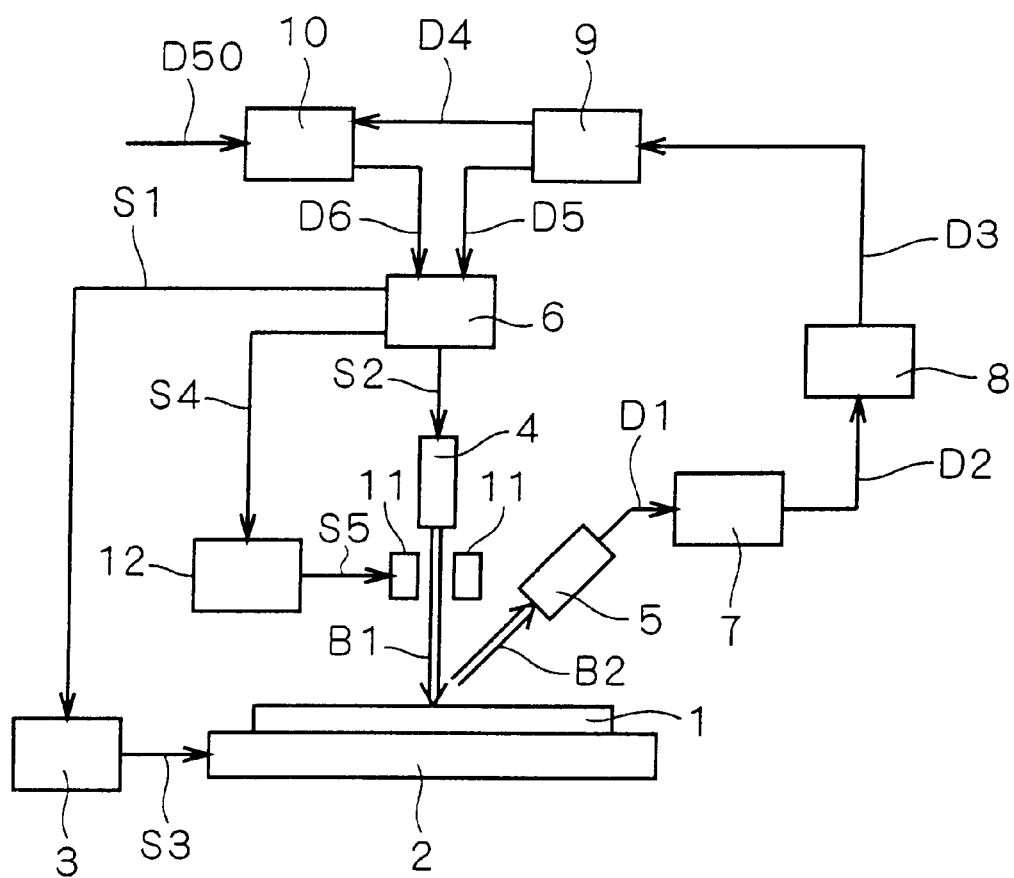
FIG. 1 is a block diagram showing a constitution of an apparatus for inspecting a semiconductor device in accordance with a first preferred embodiment of the present invention.

FIG. 1 is a block diagram showing a constitution of an apparatus for inspecting a semiconductor device in accordance with the first preferred embodiment of the present invention. As shown in FIG. 1, the inspection apparatus for a semiconductor device in accordance with the first preferred embodiment comprises a wafer stage 2 having a mounting surface on which a semiconductor wafer 1 under inspection is mounted, a stage driving unit 3 connected to the wafer stage 2, a charged-particle beam irradiation unit 4 such as an electron gun disposed above the wafer mounting surface of the wafer stage 2, an electronic optical system 11 disposed between the charged-particle beam irradiation unit 4 and the wafer stage 2, a charged-particle beam control unit 12 connected to the electronic optical system 11, a secondary-electron detection unit 5 disposed near the wafer mounting surface of the wafer stage 2, an amplifier 7 connected to an output of the secondary-electron detection unit 5, a secondary-electron intensity comparison unit 8 connected to an output of the amplifier 7, a database 9 connected to an output of the secondary-electron intensity comparison unit 8, a personal computer (PC) 10 connected to an output of the database 9 and a main control unit 6 connected to the output of the database 9 and an output of the PC 10, whose output is connected to the stage driving unit 3, the charged-particle beam irradiation unit 4 and the charged-particle beam control unit 12.

Figure 2:
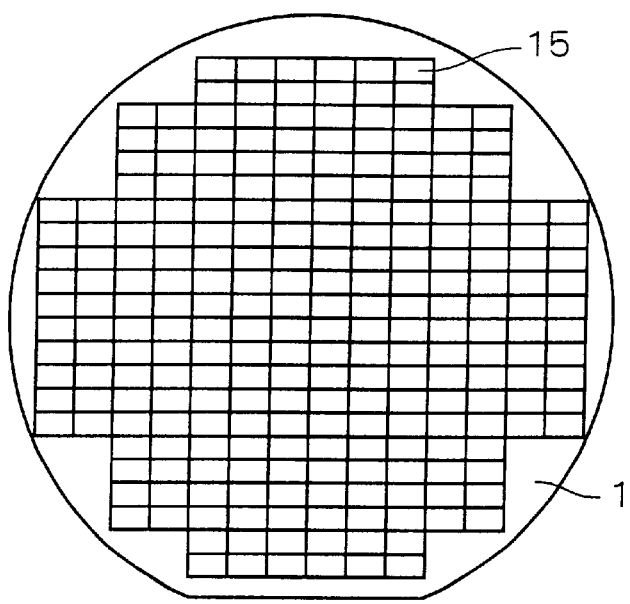
FIG. 2 is a top plan view showing a wafer surface of a semiconductor wafer.

FIG. 2 is a top plan view showing a wafer surface of the semiconductor wafer 1. In the inspection apparatus for a semiconductor device shown in FIG. 1, a small region obtained by sectioning the wafer surface of the semiconductor wafer 1 into a plurality of regions is used as a unit of inspection region 15 and whether a contact hole is opened/not-opened is inspected for each inspection region 15. Usually, an area of one inspection region 15 is smaller than an area occupied by one of chips constituting the wafer surface.

Figure 3:
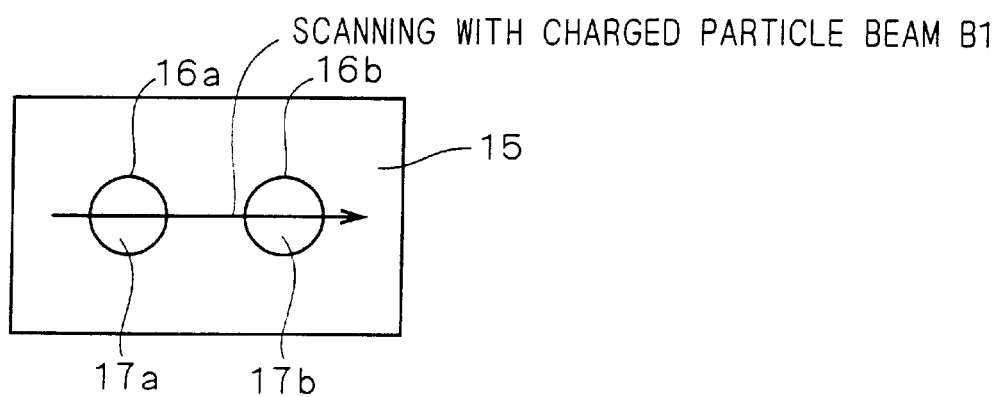
FIG. 3 is a top plan view schematically showing an inspection region.

FIG. 3 is a top plan view schematically showing one inspection region 15. A lot of contact holes 16 are formed in the semiconductor wafer 1 and a plurality of contact holes 16 are formed in each inspection region 15. In FIG. 3 shown are only two contact holes 16a and 16b as typical ones. Respective insides of the contact holes 16a and 16b are filled with plugs 17a and 17b.

Figure 4:
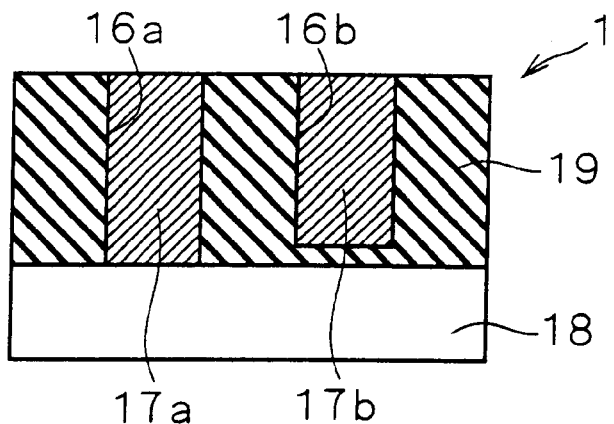
FIG. 4 is a cross section showing a cross-sectional structure of the inspection region of FIG. 3.

FIG. 4 is a cross section showing a cross-sectional structure of the inspection region 15 of FIG. 3. The semiconductor wafer 1 comprises a semiconductor substrate 18 and an interlayer insulating film 19 formed on an upper surface of the semiconductor substrate 18. Both the contact holes 16a and 16b are formed extending from an upper surface of the interlayer insulating film 19 towards its bottom surface. A bottom surface of the contact hole 16a reaches the upper surface of the semiconductor substrate 18, and on the other hand a bottom surface of the contact hole 16b does not. In other words, the contact hole 16a is opened and the contact hole 16b is not opened with an opening failure.

Figure 5:
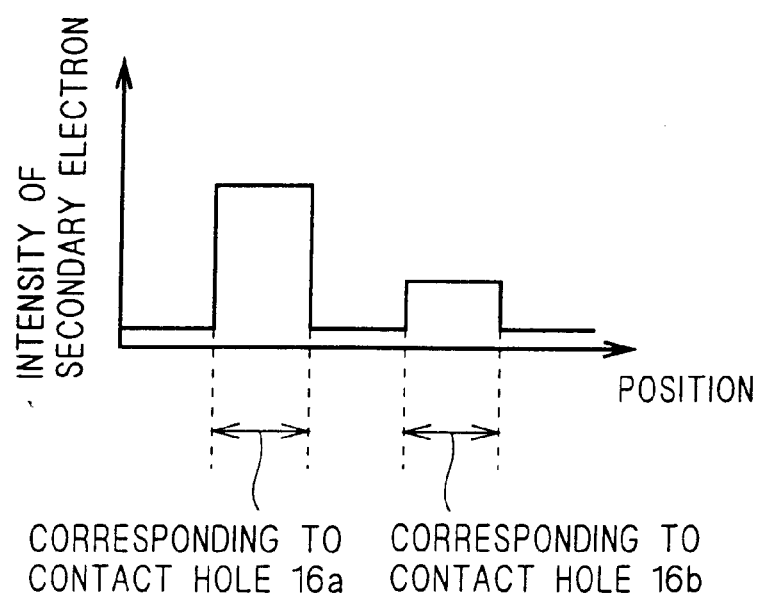
FIG. 5 is a graph showing a difference in intensity of secondary electrons caused by whether a contact hole is opened/not-opened.

In this inspection region 15, when the contact holes 16a and 16b are scanned through irradiation with a charged particle beam B1 as shown in FIG. 3, there arises difference in intensity between a secondary electron B2 generated from a portion at which the contact hole 16a is formed and a secondary electron B2 generated from a portion at which the contact hole 16b is formed, as shown in FIG. 5, which is caused by potential difference of the hole surface and the like based on difference in electric capacity. Therefore, observation of brightness of a secondary electron image caused by the intensity difference allows inspection on whether the contact hole 16 is opened/not-opened.

Figure 6:
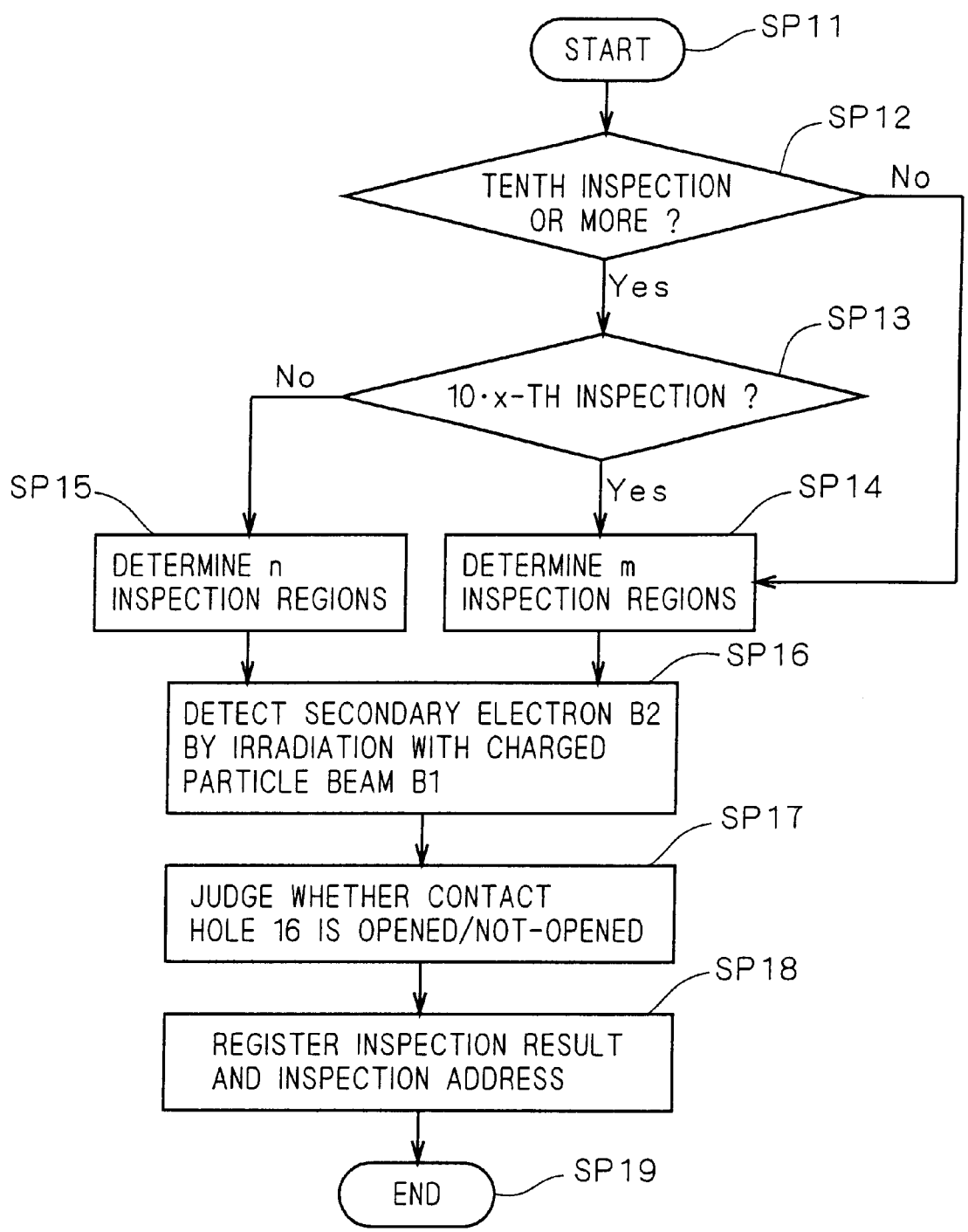
FIG. 6 is a flow chart used to explain a method of inspecting a semiconductor device in accordance with the first preferred embodiment of the present invention.

Specific discussion will be made below on an operation of the inspection apparatus for a semiconductor device shown in FIG. 1. A plurality of semiconductor wafers of the same kind formed through the same process (i.e., semiconductor wafers having the same structure) are sequentially transported to the inspection apparatus, where each semiconductor wafer is inspected in order. FIG. 6 is a flow chart used to explain a method of inspecting a semiconductor device in accordance with the first preferred embodiment of the present invention. First, the semiconductor wafer 1 to be currently inspected (for convenience of discussion, also referred to as "wafer 1 under inspection")is transported into the inspection apparatus and mounted on a predetermined portion of the wafer mounting surface of the wafer stage 2 in alignment. Then, the inspection starts (step SP11).

In the inspection apparatus, judgment is made on whether or not this inspection on the wafer 1 under inspection is the predetermined-number-th inspection or more (hereinafter, tenth or more as an example), in other words, whether or not nine or more semiconductor wafers of the same structure have been already inspected before the inspection of the wafer 1 under inspection starts (step SP12).

When the judgment result in the step SP12 is "Yes",in the inspection apparatus, judgment is made on whether or not this inspection on the wafer 1 under inspection is the 10·x-th (x: natural number) inspection (step SP13).

When the judgment result in the step SP13 is "Yes" or the judgment result in the step SP12 is "No",m inspection regions 15 to be inspected are determined among a plurality of inspection regions 15 in the wafer surface of the wafer 1 under inspection (step SP14). The m inspection regions 15 are inputted to the PC 10 by an operator as data D50 and further inputted from the PC 10 to the main control unit 6 as data D6. The operator specifies any portions that are expected, in consideration to the process, to have opening failures of the contact holes 16 therein as the m inspection regions 15, referring to past inspection results and the like. For example, a region in which the contact holes 16 are densely formed, a peripheral portion of the semiconductor wafer 1 and the like are specified.

Subsequently to the step SP14, the inspection apparatus detects the secondary electron B2 by irradiation with the charged particle beam B1 (step SP16). Specific operation is as follows. The main control unit 6 generates a control signal S1 on the basis of the data D6 and inputs it to the stage driving unit 3 so that one of the m inspection regions 15 may be positioned immediately below the charged-particle beam irradiation unit 4. The stage driving unit 3 drives the wafer stage 2 on the basis of the control signal S1. Further, instead of driving the wafer stage 2, the unit 3 may drive the charged particle beam irradiation unit 4. In other words, it is only necessary to relatively move the wafer stage 2 and the charged-particle beam irradiation unit 4. After that, the main control unit 6 inputs a control signal S2 to the charged-particle beam irradiation unit 4 and the charged-particle beam irradiation unit 4 irradiates the one of the inspection regions 15 with the charged particle beam B1 on the basis of the control signal S2. Along with this, the main control unit 6 inputs a control signal S4 to the charged-particle beam control unit 12 and the charged-particle beam control unit 12 controls an orbit of the charged particle beam B1 with the electronic optical system 11 on the basis of a control signal S5. Then, the secondary-electron detection unit 5 detects the secondary electron B2 generated by irradiating the inspection region 15 with the charged particle beam B1, to obtain the secondary electron image of the inspection region 15.

Subsequently to the step SP16, the inspection apparatus judges whether the contact hole 16 is opened/not-opened (step SP17). Specific operation is as follows. The amplifier 7 amplifies a detection result D1 of the secondary electron B2 by the secondary-electron detection unit 5 and inputs an amplified result D2 to the secondary-electron intensity comparison unit 8. As discussed above, there arises difference in intensity of the secondary electron B2 generated by irradiation with the charged particle beam B1 between the contact hole 16a which is opened and the contact hole 16b which is not opened. The secondary-electron intensity comparison unit 8 converts the brightness of secondary electron image into numbers or gradation and relatively compares respective numbers or gradations with respect to the contact holes 16, to judge whether the contact holes 16 formed in the inspection region 15 are each opened/not-opened.

Subsequently to the step SP17, the inspection apparatus registers the inspection result on the inspection region 15 and an inspection address in correspondence with each other to the database 9 as a data D3 (step SP18). Further, there may be a case where the inspection apparatus obtains an inspection image on the inspection region 15 in the step SP16 and registers the inspection image and the inspection address in correspondence with each other to the database 9 in the step SP18. These information items are registered and stored every time when the inspection is made on other inspection regions 15 of the wafer 1 under inspection or other semiconductor wafer 1, and further can be taken out to the outside of the inspection apparatus through the PC 10 as the data D4.

When the judgment result in the step SP13 is "No", in the inspection apparatus, n (<m) inspection regions 15 to be inspected are determined among the m inspection regions 15 (step SP15). Specific operation is as follows. First, the main control unit 6 reads the information (particularly, the inspection result and the inspection address) out from the database 9 as data D5. At this time, the database 9 stores the inspection results and the inspection addresses on the m inspection regions 15 for each of at least nine semiconductor wafers 1. Referring to the information, the main control unit 6 identifies the highest n inspection regions 15 in frequency with which the opening failure of the contact holes 16 occurs (in other words, high-incidence of failure) in at least nine semiconductor wafers 1 among the m inspection regions 15. After the step SP15 is completed, in the steps SP16 to SP18, the above inspection is made on the n inspection regions 15 and the information is stored in the database 9.

Further, there may be another case where the database 9 is removed from the constitution of FIG. 1 and the steps SP12, SP13 and SP15 are omitted from the flow chart of FIG. 6. This also applies to the second to fourth preferred embodiments discussed later. In this case, the step SP11 is followed by the step SP14.

Furthermore, there may be another case where the PC 10 is removed from the constitution of FIG. 1 and the step SP14 is omitted from the flow chart of FIG. 6. In this case, when the judgment result in the step SP13 is "Yes", the inspection is made on all the inspection regions 15 in the wafer surface of the wafer 1 under inspection.

Thus, the method of and apparatus for inspecting a semiconductor device in accordance with the first preferred embodiment ensures simplification of constitution and reduction in time needed for inspection as compared with the background-art method of and apparatus for inspecting a semiconductor device using the defect inspection device, and further enhances reliability as compared with the background-art method of and apparatus for inspecting a semiconductor device which judge whether the contact hole is opened/not-opened only by measuring the hole diameter. Furthermore, since all the inspection regions in the wafer surface are not inspected, it is possible to reduce the time needed for inspection as compared with a case where all the inspection regions are inspected. Moreover, since specified m inspection regions that are expected to have opening failures of the contact hole are inspected, it is possible to efficiently detect occurrence of opening failure.

After the inspection on a predetermined number of semiconductor wafers or more is completed and respective inspection results and inspection addresses on the m inspection regions are stored in the database to some degree, instead of all the m inspection regions, only the highest n inspection regions in frequency with which the opening failure of the contact holes occurs in a plurality of semiconductor wafers are inspected. Therefore, it is possible to further reduce the time needed for inspection and further enhance the efficiency of inspection.

The Second Preferred Embodiment

Figure 7:
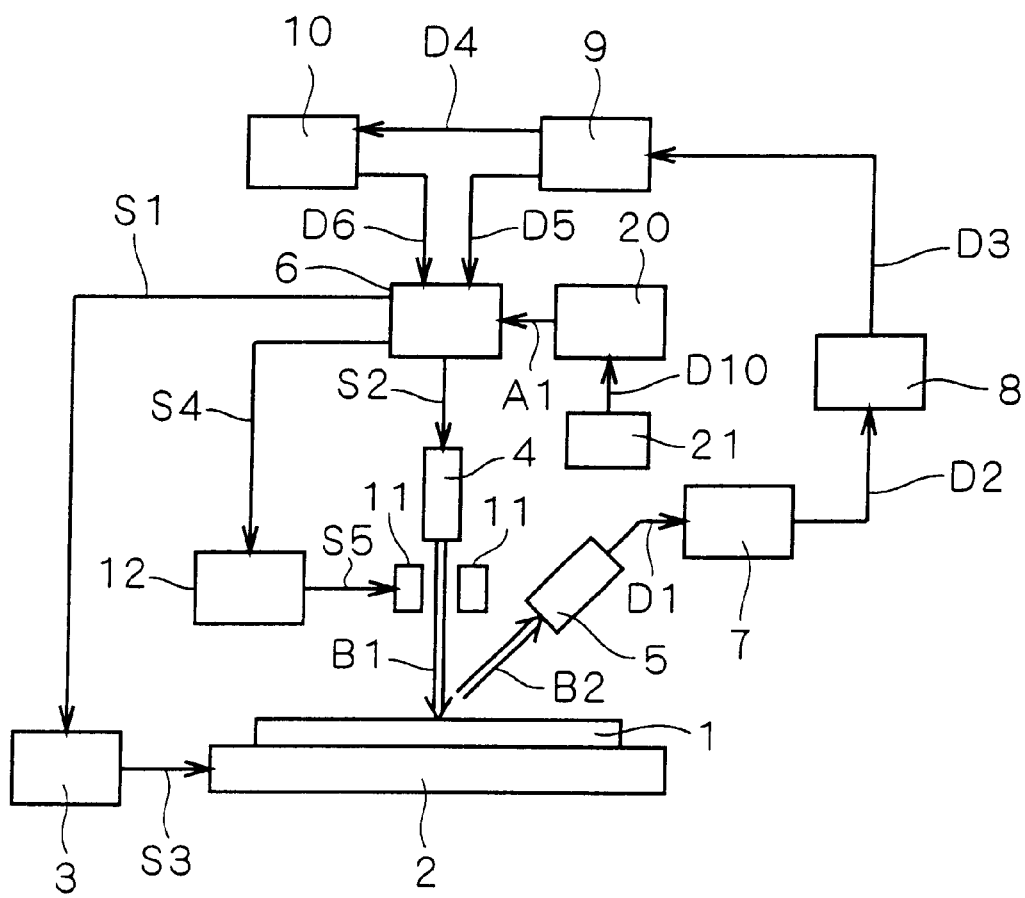
FIG. 7 is a block diagram showing a constitution of an apparatus for inspecting a semiconductor device in accordance with a second preferred embodiment of the present invention.

FIG. 7 is a block diagram showing a constitution of an apparatus for inspecting a semiconductor device in accordance with the second preferred embodiment of the present invention. The inspection apparatus for a semiconductor device in accordance with the second preferred embodiment shown in FIG. 7 has a base constitution of the inspection apparatus for a semiconductor device in accordance with the first preferred embodiment shown in FIG. 1 and further comprises an inspection address determination unit 20 having an output connected to an input of the main control unit 6 and a CAD data memory unit 21 having an output connected to an input of the inspection address determination unit 20. The CAD data memory unit 21 stores CAD data D10 which is design data of the semiconductor wafer 1 in advance.

In the above inspection method for a semiconductor device of the first preferred embodiment, the operator teaches the m inspection regions 15 to the main control unit 6 through the PC 10 in th step SP14. In contrast to this, the following method is used to determine the m inspection regions 15, instead of executing the step SP14, in the inspection method for a semiconductor device of the second preferred embodiment.

Figure 8:
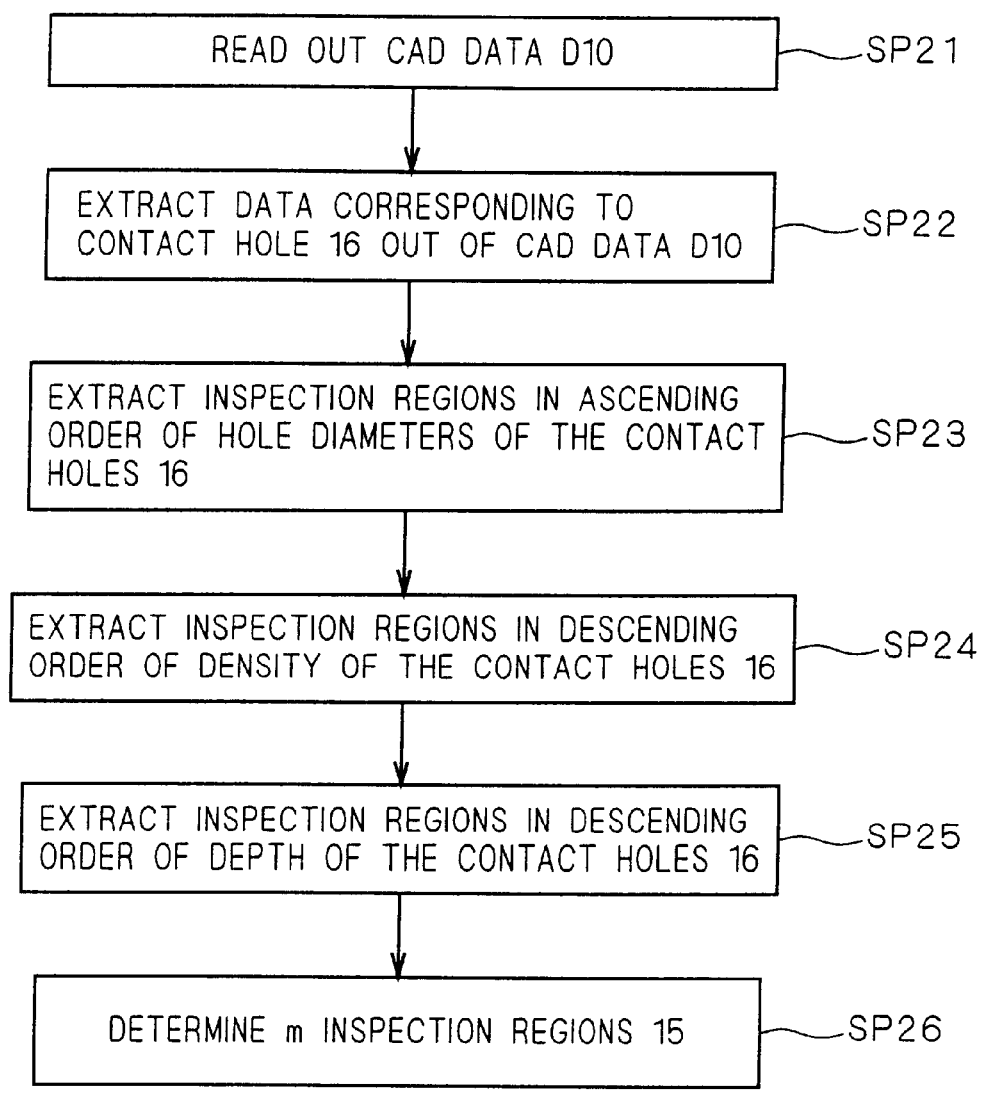
FIG. 8 is a flow chart used to explain a method of determining m inspection regions in a method of inspecting a semiconductor device in accordance with the second preferred embodiment of the present invention.

FIG. 8 is a flow chart used to explain a method of determining the m inspection regions 15 in the method of inspecting a semiconductor device in accordance with the second preferred embodiment of the present invention. First, the inspection address determination unit 20 reads the CAD data D10 out from the CAD data memory unit 21 (step SP21). Subsequently, the inspection address determination unit 20 extracts data on portions where the contact holes 16 are formed out of the read-out CAD data D10 (step SP22).

Next, the inspection address determination unit 20 selects a portion where the opening failure is structurally likely to occur, referring to the information gained in the step SP22. Specific operation is as follows. First, the inspection address determination unit 20 extracts m1 inspection regions 15 among a plurality of inspection regions 15 in the wafer surface in ascending order of hole diameters of the contact holes 16 formed in the inspection regions 15 (step SP23). Subsequently, the inspection address determination unit 20 extracts m2 inspection regions 15 among a plurality of inspection regions 15 in the wafer surface in descending order of density of the contact holes 16 formed in the inspection regions 15 (step SP24). The density of the contact holes 16 is obtained by counting the number of contact holes 16 formed per unit area. Subsequently, the inspection address determination unit 20 extracts m3 inspection regions 15 among a plurality of inspection regions 15 in the wafer surface in descending order of depth of the contact holes 16 formed in the inspection regions 15 (step SP25).

Subsequently to the step SP25, the inspection address determination unit 20 controls the values m1, m2 and m3 so as to satisfy the relation m1+m2+m3=m, to determine the m inspection regions 15 (step SP26). The inspection address determination unit 20 inputs respective address data A1 of the m inspection regions 15 thus determined to the main control unit 6.

Thus, in the method of and apparatus for inspecting a semiconductor device in accordance with the second preferred embodiment, to determine the m inspection regions to be inspected, the operator teaches nothing to the inspection apparatus, but the inspection apparatus automatically identifies the m inspection regions on the basis of the design data of the semiconductor wafer under inspection. Therefore, it is possible to achieve automatization of the inspection and ensure uniformization of inspection accuracy.

The Third Preferred Embodiment

Figure 9:
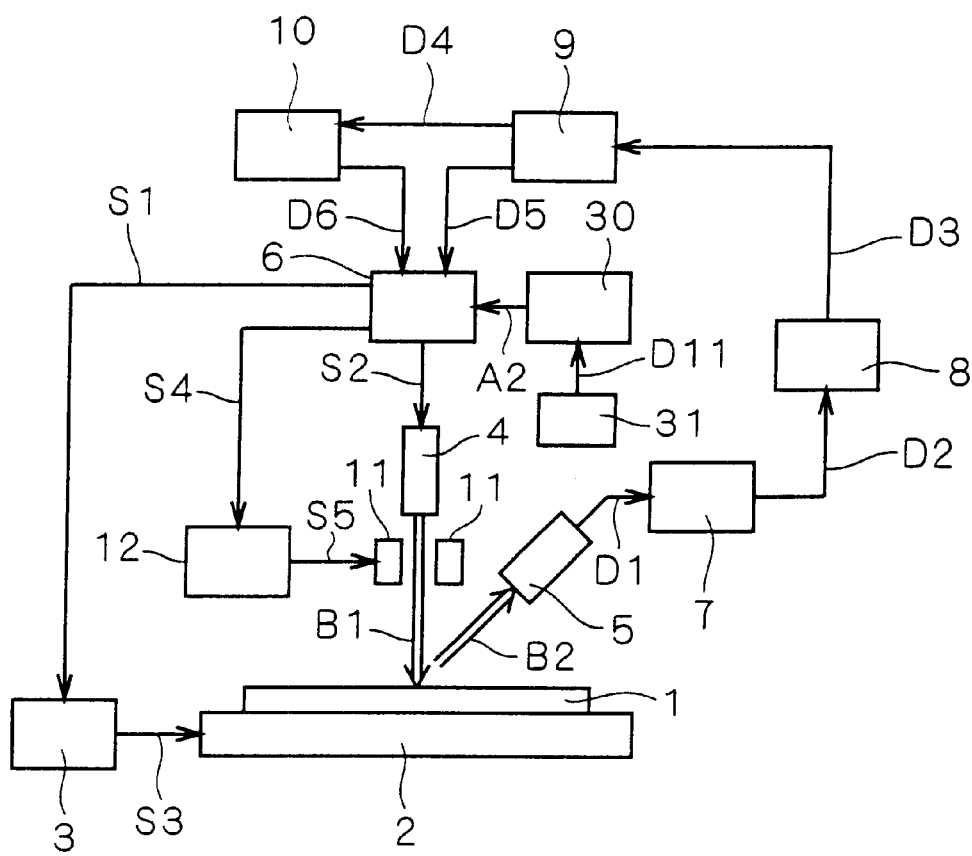
FIG. 9 is a block diagram showing a constitution of an apparatus for inspecting a semiconductor device in accordance with a third preferred embodiment of the present invention.

FIG. 9 is a block diagram showing a constitution of an apparatus for inspecting a semiconductor device in accordance with the third preferred embodiment of the present invention. The inspection apparatus for a semiconductor device in accordance with the third preferred embodiment shown in FIG. 9 has a base constitution of the inspection apparatus for a semiconductor device in accordance with the first preferred embodiment shown in FIG. 1 and further comprises an inspection address determination unit 30 having an output connected to the input of the main control unit 6 and an FBM (Fail Bit Map) data memory unit 31 having an output connected to an input of the inspection address determination unit 30. The FBM data memory unit 31 stores, in advance, a plurality of FBM data D11 indicating defective distribution in the wafer surface obtained on a plurality of products already manufactured by using chips obtained from other semiconductor wafer having the same structure as the wafer 1 under inspection. For example, the FBM data D11 on the latest ten FBMs are stored.

Figure 10:
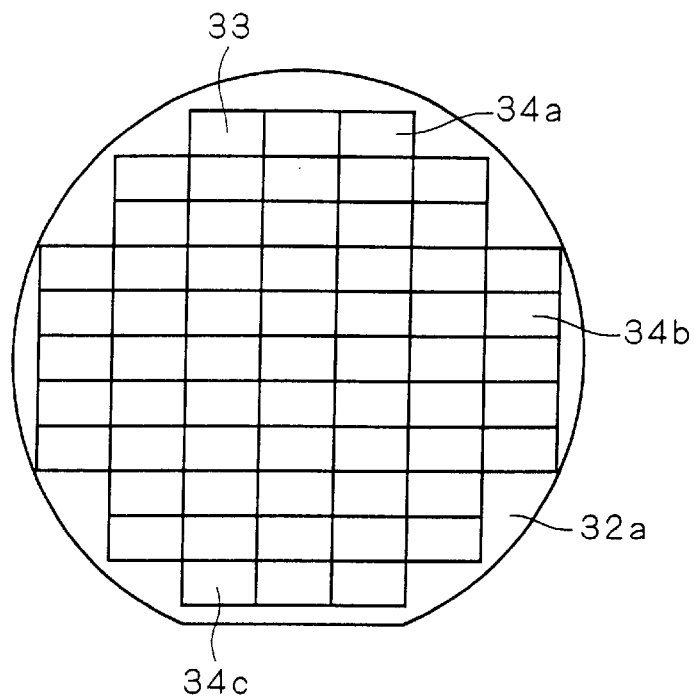
FIG. 10 illustrates an FBM.
Figure 11:
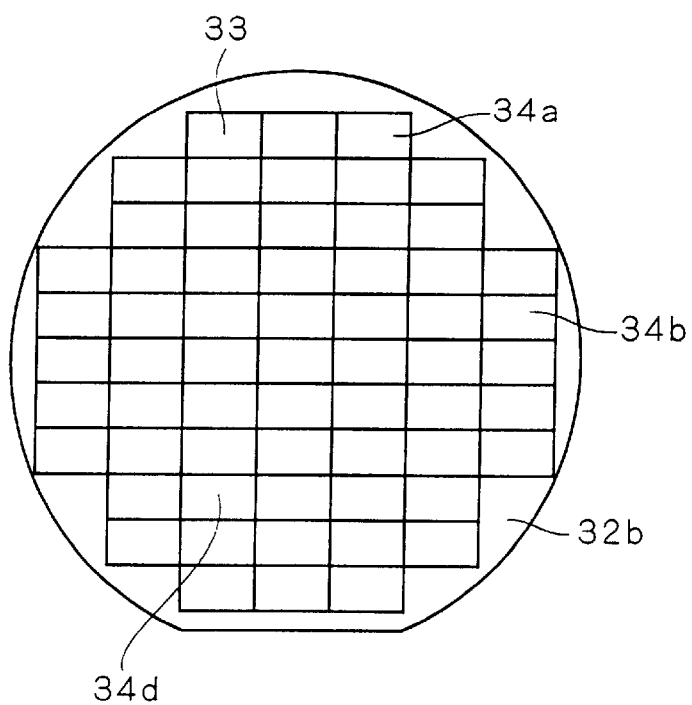
FIG. 11 illustrates another FBM.

FIGS. 10 and 11 illustrate two different FBMs 32a and 32b. In the FBMs 32a and 32b, a plurality of virtual chips 33 formed in the same arrangement as the chip arrangement in the wafer surface of the semiconductor wafer 1. Some virtual chips 33 corresponding to the chips that are supposed to be defective due to the opening failure of the contact hole, such as contact failure of wires, are represented as defective chips 34 so as to be distinguished from other virtual chips 33. For example, in the FBM 32a, three defective chips 34a, 34b and 34c are shown as the defective chips 34, and in the FBM 32b, three defective chips 34a, 34b and 34d are shown as the defective chips 34.

In the method of inspecting a semiconductor device in according to the first preferred embodiment, the operator teaches the m inspection regions 15 to the main control unit 6 through the PC 10 in the step SP14. In contrast to this, the following method is used to determine the m inspection regions 15, instead of executing the step SPI4, in the method of inspecting a semiconductor device in according to the third preferred embodiment.

Figure 12:
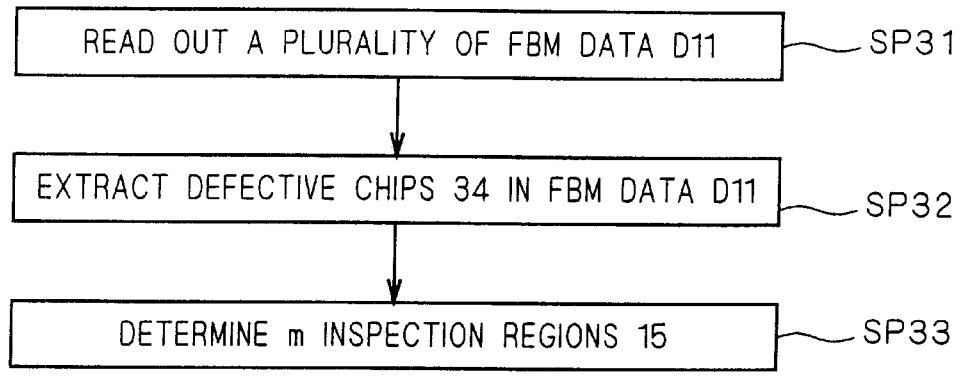
FIG. 12 is a flow chart used to explain a method of determining m inspection regions in a method of inspecting a semiconductor device in accordance with the third preferred embodiment of the present invention.

FIG. 12 is a flow chart used to explain the method of determining m inspection regions 15 in the method of inspecting a semiconductor device in accordance with the third preferred embodiment. First, the inspection address determination unit 30 reads a plurality of FBM data D11 stored in the FBM data memory unit 31 (step SP31). Subsequently the inspection address determination unit 30 extracts the addresses of the defective chips 34 for each FBM data D11 (step SP32).

Next, the inspection address determination unit 30 identifies one or a plurality of defective chips 34 in descending order of frequency of presence in a plurality of FBMs 32 among a plurality of defective chips 34 by referring to the addresses extracted in the step SP32 for each FBM 32. For example, in the examples of FIGS. 10 and 11, the defective chips 34a and 34b are found in both the FBMs 32a and 32b and the defective chips 34c and 34d are not found in both the FBMs 32a and 32b. Then, the inspection address determination unit 30 determines the m inspection regions 15 corresponding to the identified defective chips 34 (step SP33). After that, the inspection address determination unit 30 inputs address data A2 of each of the m inspection regions 15 determined thus to the main control unit 6.

Thus, the method of and apparatus for inspecting a semiconductor device in accordance with the third preferred embodiment produce the following effect as well as that obtained by the method of and apparatus for inspecting a semiconductor device in accordance with the second preferred embodiment. Specifically, by referring to the FBM obtained on actual products, it is possible to determine the m inspection regions with consideration to total causes of failure including processing problems as well as the structural problems.

The Fourth Preferred Embodiment

Figure 13:
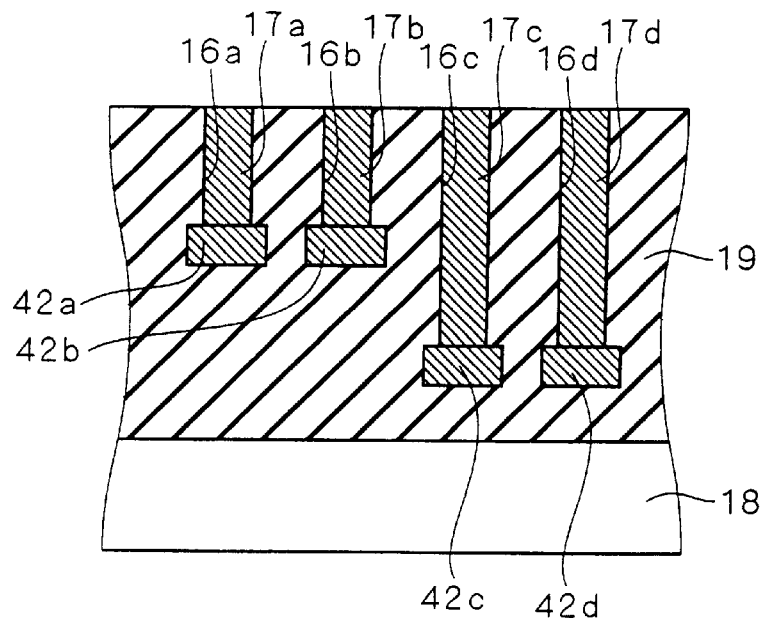
FIG. 13 is a cross section showing part of a structure of an inspection region.

FIG. 13 is a cross section showing part of a structure of an inspection region 15. In the interlayer insulating film 19, wires 42c and 42d are formed as first layer wires and wires 42a and 42b are formed as second layer wires. The wires 42a to 42d each extend along a direction perpendicular to the paper. In an upper surface of the interlayer insulating film 19, contact holes 16a to 16d whose insides are filled with plugs 17a to 17d, respectively, are formed and connected to the wires 42a to 42d, respectively. The wires 42a and 42b are equivalent and the wires 42c and 42d are equivalent in structural elements such as width, length and height, and the wires 42a and 42b and the wires 42c and 42d are different from each other. The wires 42a to 42d uses the same material. Therefore, on this assumption, when the wires 42a and 42b each have electric capacity C1, the wires 42c and 42d each have electric capacity C2 different from the electric capacity C1. Though only the four contact holes 16a to 16d are shown in FIG. 13, there are contact holes having the same structure as the contact hole 16a (referred to as "first contact holes" for convenience of description) connected to the wire 42a at the near side or far side of this paper, contact holes ("second contact holes")connected to the semiconductor substrate 18, and the like.

Now, we consider a case of observing a secondary electron image of a portion in which the contact holes 16b and 16c are formed after the inspection region 15 of FIG. 13 is irradiated with the charged-particle beam B1. As mentioned above, the wire 42b has the electric capacity C1 and the wire 42c has the electric capacity C2. Since the wires 42b and 42c are different in electric capacity from each other, the contact holes 16b and 16c after irradiation with the charged-particle beam B1 are different in potential of their surfaces from each other and as a result, the secondary electrons B2 discharged from the surfaces of the contact holes 16b and 16c are different in intensity from each other. Therefore, though both the contact holes 16b and 16c has no opening failure as shown in FIG. 13, with the difference in intensity of the secondary electrons, it is judged that one of the contact holes 16b and 16c has an opening failure. The fourth preferred embodiment proposes a method of and an apparatus for inspecting a semiconductor device which avoid this inspection error.

Figure 14:
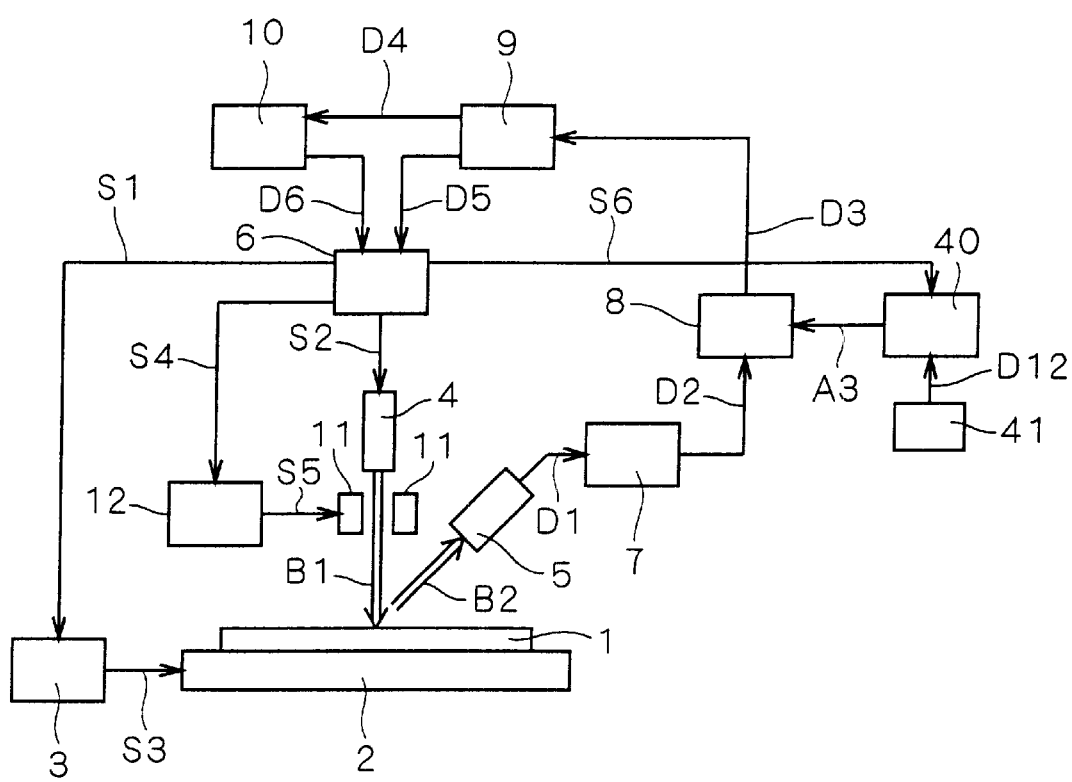
FIG. 14 is a block diagram showing a constitution of an apparatus for inspecting a semiconductor device in accordance with a fourth preferred embodiment of the present invention.

FIG. 14 is a block diagram showing a constitution of an apparatus for inspecting a semiconductor device in accordance with the fourth preferred embodiment of the present invention. As shown in FIG. 14, the inspection apparatus for a semiconductor device in accordance with the fourth preferred embodiment has a base constitution of the inspection apparatus for a semiconductor device in accordance with the first preferred embodiment shown in FIG. 1 and further comprises an inspection grouping unit 40 having an output connected to an input of the secondary-electron intensity comparison unit 8 and a CAD data memory unit 41 having an output connected to an input of the inspection grouping unit 40. The CAD data memory unit 41 stores CAD data D12 which is the design data of the semiconductor wafer 1 in advance.

Figure 15:
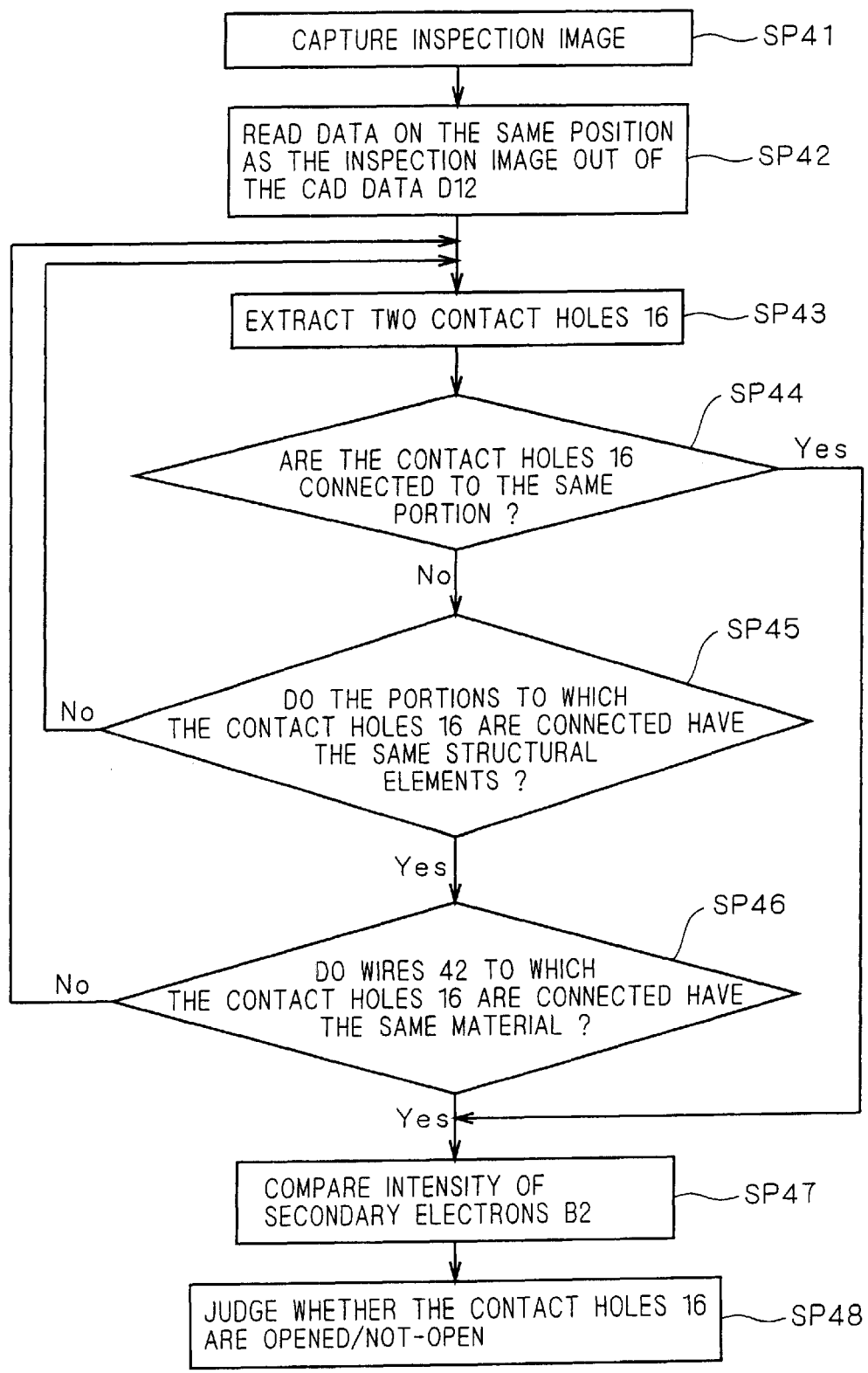
FIG. 15 is a flow chart used to explain a method of judging whether a contact hole is opened/not-opened by a secondary-electron intensity comparison unit in a method of inspecting a semiconductor device in accordance with the fourth preferred embodiment of the present invention.
Figure 16:
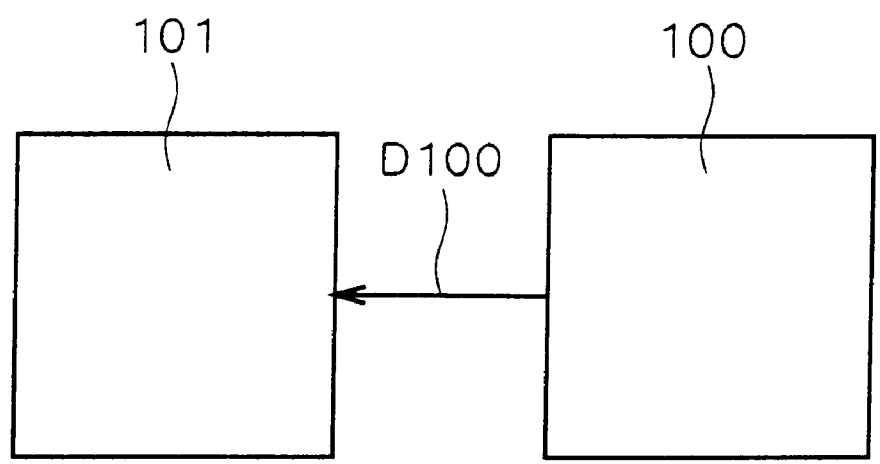
FIG. 16 is a view conceptually showing an apparatus for inspecting a semiconductor device in the background art.

FIG. 15 is a flow chart used to explain a method of judging whether a contact hole 16 is opened/not-opened by a secondary-electron intensity comparison unit 8 in the method of inspecting a semiconductor device in accordance with the fourth preferred embodiment of the present invention. First, the secondary-electron intensity comparison unit 8 captures an inspection image (step SP41). Specifically, the amplified result D2 is inputted from the amplifier 7 to the secondary-electron intensity comparison unit 8. Subsequently, the inspection grouping unit 40 reads CAD data on the same position as the inspection image (i.e., CAD data corresponding to the current inspection region 15) among the CAD data D12 stored in the CAD data memory unit 41 (step SP42).

Next, the inspection grouping unit 40 groups a plurality of contact holes 16 included in the CAD data D12 read out in the step SP42 into a plurality of groups by the electric capacity at portions to which the contact holes 16 are connected. Specifically, the following steps SP43 to SP46 are executed. First, the inspection grouping unit 40 arbitrarily extracts two contact holes 16 out of the CAD data D12 read out in the step SP42 (step SP43).

The inspection grouping unit 40 judges whether the two contact holes 16 extracted in the step SP43 are connected to the same portion or not by referring to the CAD data D12 read out in the step SP42 (step SP44). For example, we consider a case where the inspection grouping unit 40 extracts the contact hole 16a of FIG. 13 and the first contact hole in the step SP43. In this case, since both the contact holes are connected to the wires 42a, the judgment result of the inspection grouping unit 40 in the step SP44 is "Yes". On the other hand, we consider another case where the inspection grouping unit 40 extracts the contact hole 16a of FIG. 13 and the second contact hole in the step SP43. In this case, the contact hole 16a is connected to the wire 42a while the second contact hole is connected to the semiconductor substrate 18. Therefore, the judgment result of the inspection grouping unit 40 in the step SP44 is "No".

When the judgment result in the step SP44 is "No", the inspection grouping unit 40 judges whether the portions to which the contact holes 16 are connected have the same structural elements (length, width, height and the like if the portion is the wire 42) or not by referring to the CAD data D12 read out in the step SP42 (step SP45). For example, we consider a case where the inspection grouping unit 40 extracts the contact holes 16a and 16b of FIG. 13 in the step SP43. In this case, since the wires 42a and 42b to which the contact holes 16a and 16b are connected have the same structural elements, the judgment result of the inspection grouping unit 40 in the step SP45 is "Yes". On the other hand, we consider another case where the inspection grouping unit 40 extracts the contact holes 16a and 16c of FIG. 13 in the step SP43. In this case, since the wires 42a and 42c to which the contact holes 16a and 16c are connected have different structural elements, the judgment result of the inspection grouping unit 40 in the step SP45 is "No".

When the judgment result in the step SP45 is "Yes", the inspection grouping unit 40 judges whether the wires 42 to which the contact holes 16 are connected have the same material or not by referring to the CAD data D12 read out in the step SP42 (step SP46). For example, we consider a case where the inspection grouping unit 40 extracts the contact holes 16c and 16d of FIG. 13 in the step SP43. In this case, since the wires 42c and 42d to which the contact holes 16c and 16d are connected have the same material, the judgment result of the inspection grouping unit 40 in the step SP46 is "Yes".

When the judgment result in the step SP44 is "Yes" or that in the step SP46 is "Yes", the electric capacities at the portions to which the two contact holes 16 extracted in the step SP43 are connected are equal. On the other hand, when both the judgment results in the steps SP45 and SP46 are "No", the electric capacities at the portions to which the two contact holes 16 extracted in the step SP43 are connected are different from each other. In this case, back to the step SP43, another two contact holes 16 are extracted again and the above operations are repeated.

The inspection grouping unit 40 repeatedly performs the operations of the steps SP43 to SP46 until all the contact holes 16 included in the CAD data D12 read out in the step SP42 are grouped into any groups by the electric capacity at the portions to which the contact holes 16 are connected. The grouping result of the contact holes 16 made by the inspection grouping unit 40 is inputted to the secondary-electron intensity comparison unit 8 as data A3.

The secondary-electron intensity comparison unit 8 compares the intensity of the secondary electrons B2 by the group of the contact holes 16 on the basis of the data A3 for all the contact holes 16 included in the amplified result D2 inputted from the amplifier 7 (step SP47), to judge whether the contact holes 16 are opened/not-opened (step SP48).

Thus, in the method of and apparatus for inspecting a semiconductor device in accordance with the fourth preferred embodiment, the secondary-electron intensity comparison unit judges whether the contact holes are opened/not-opened on the basis of the grouping result of the inspection grouping unit by the group of the contact holes which are connected to the portions having the same electric capacity. Therefore, it is possible to avoid the inspection error due to difference in electric capacity at the portions to which the contact holes are connected and improve the inspection accuracy.

While the invention has been shown and described in detail, the foregoing description is in all aspects illustrative and not restrictive. It is therefore understood that numerous modifications and variations can be devised without departing from the scope of the invention.

What is claimed is:

1. A method of inspecting a semiconductor device, wherein one of semiconductor wafers each provided with a plurality of holes is mounted on a stage as a semiconductor wafer under inspection, and assuming that small regions obtained by sectioning a wafer surface of said semiconductor wafer under inspection into a plurality of regions are defined as inspection regions, each of said inspection regions is irradiated with charged particles from a charged-particle irradiation unit and a secondary electron image obtained by irradiation with said charged particles is observed, to inspect whether or not there occurs an opening failure in said holes inside each of said small regions, said method comprising the steps of:
(a) inputting positional data on at least one specified small region to a control unit, said at least one specified small region being more likely to have said opening failure than the others of said small regions in said wafer surface; and
(b) inspecting whether or not there occurs said opening failure in said at least one specified small region while said control unit relatively moves said charged-particle irradiation unit and said stage on a basis of said positional data so that said at least one specified small region is irradiated with said charged particles, wherein said step (a) includes the steps of:
(a-1) inputting design data of said semiconductor wafers to an inspection-region determination unit; and
(a-2) identifying said at least one specified small region on the basis of said design data by said inspection-region determination unit.

2. The method according to claim 1, wherein said step (a-2) includes at least one of the steps of:
(a-2-1) extracting a predetermined number of said inspection regions in ascending order of diameter of said holes formed in said small regions;
(a-2-2) extracting a predetermined number of said inspection regions in descending order of density of said holes formed in said small regions; and
(a-2-3) extracting a predetermined number of said inspection regions in descending order of depth of said holes formed in said small regions.

3. A method of inspecting a semiconductor device, wherein one of semiconductor wafers each provided with a plurality of holes is mounted on a stage as a semiconductor wafer under inspection, and assuming that small regions obtained by sectioning a wafer surface of said semiconductor wafer under inspection into a plurality of regions are defined as inspection regions, each of said inspection regions is irradiated with charged particles from a charged-particle irradiation unit and a secondary electron image obtained by irradiation with said charged particles is observed, to inspect whether or not there occurs an opening failure in said holes inside each of said small regions, said method comprising the steps of:
(a) inputting positional data on at least one specified small region to a control unit, said at least one specified small region being more likely to have said opening failure than the others of said small regions in said wafer surface; and
(b) inspecting whether or not there occurs said opening failure in said at least one specified small region while said control unit relatively moves said charged-particle irradiation unit and said stage on a basis of said positional data so that said at least one specified small region is irradiated with said charged particles, wherein said step (a) includes the steps of:
(a-1) inputting a defective distribution in said wafer surface obtained on a plurality of products already manufactured by using chips obtained from other said semiconductor wafers having the same structure as said semiconductor wafer under inspection to an inspection-region determination unit; and
(a-2) identifying a specified region in said wafer surface, which is likely to have a defect, on the basis of said defective distribution by said inspection-region determination unit, to determine said small region corresponding to said specified region as said specified small region.

4. A method of inspecting a semiconductor device, wherein one of semiconductor wafers each provided with a plurality of holes is mounted on a stage as a semiconductor wafer under inspection, and assuming that small regions obtained by sectioning a wafer surface of said semiconductor wafer under inspection into a plurality of regions are defined as inspection regions, each of said inspection regions is irradiated with charged particles from a charged-particle irradiation unit and a secondary electron image obtained by irradiation with said charged particles is observed, to inspect whether or not there occurs an opening failure in said holes inside each of said small regions, said method comprising the steps of:
(a) inputting positional data on at least one specified small region to a control unit, said at least one specified small region being more likely to have said opening failure than the others of said small regions in said wafer surface; and
(b) inspecting whether or not there occurs said opening failure in said at least one specified small region while said control unit relatively moves said charged-particle irradiation unit and said stage on a basis of said positional data so that said at least one specified small region is irradiated with said charged particles, wherein said at least one specified small region includes a plurality of specified small regions,
said method further comprising the steps of:
(c) storing inspection results on other semiconductor wafers having a same structure as said semiconductor wafer under inspection obtained through said method of inspection into a database; and
(d) identifying a failure high-incidence region at which said opening failure frequently occurs in said semiconductor wafers among said plurality of specified small regions while said control unit refers to said database,
and wherein inspection on whether or not there occurs said opening failure is made only on said failure high-incidence region in said step (b).

5. The method according to claim 4, further comprising the step of:
(e) inspecting whether or not there occurs said opening failure in said specified small regions in units of a predetermined number of said semiconductor wafers, to update said database.

6. A method of inspecting a semiconductor device, wherein one of semiconductor wafers each provided with a plurality of holes is mounted on a stage as a semiconductor wafer under inspection, and assuming that small regions obtained by sectioning a wafer surface of said semiconductor wafer under inspection into a plurality of regions are defined as inspection regions, each of said inspection regions is irradiated with charged particles from a charged-particle irradiation unit and a secondary electron image obtained by irradiation with said charged particles is observed, to inspect whether or not there occurs an opening failure in said holes inside each of said small regions, said method comprising the steps of:
- (a) inputting positional data on at least one specified small region to a control unit, said at least one specified small region being more likely to have said opening failure than the others of said small regions in said wafer surface; and
- (b) inspecting whether or not there occurs said opening failure in said at least one specified small region while said control unit relatively moves said charged-particle irradiation unit and said stage on a basis of said positional data so that said at least one specified small region is irradiated with said charged particles,
  - wherein said plurality of holes include a plurality of said holes belonging to a first group and a plurality of said holes belonging to a second group which are different from each other in intensity of secondary electrons generated from surfaces of said holes by irradiation with said charged particles even when there occurs no opening failure, and said step (b) includes the steps of:
- (b-1) grouping said plurality of holes included in said at least one specified small region into said holes belonging to said first group and said holes belonging to said second group;
- (b-2) inspecting whether or not there occurs said opening failure in said holes belonging to said first group; and
- (b-3) inspecting whether or not there occurs said opening failure in said holes belonging to said second group, said step (b-3) being separately performed from said step (b-2).

7. The method according to claim 6, wherein said plurality of holes are grouped according to electric capacity at a portion to which said holes are connected in said step (b-1).

8. A method of inspecting a semiconductor device, wherein one of semiconductor wafers each provided with a plurality of holes is mounted on a stage as a semiconductor wafer under inspection, and assuming that small regions obtained by sectioning a wafer surface of said semiconductor wafer under inspection into a plurality of regions are defined as inspection regions, each of said inspection regions is irradiated with charged particles from a charged-particle irradiation unit and a secondary electron image obtained by irradiation with said charged particles is observed, to inspect whether or not there occurs an opening failure in said holes inside each of said small regions, said method comprising the steps of:
- (a) storing inspection results on other semiconductor wafers having a same structure as said semiconductor wafer under inspection obtained through said method of inspection into a database;
- (b) identifying a failure high-incidence region at which said opening failure frequently occurs in said semiconductor wafers among said plurality of small regions while a control unit refers to said database; and
- (c) inspecting whether or not there occurs said opening failure in said failure high incidence region while said control unit relatively moves said charged-particle irradiation unit and said stage so that said failure high-incidence region is irradiated with said charged particles in said semiconductor wafer under inspection.

9. The method according to claim 8, wherein said plurality of holes include a plurality of said holes belonging to a first group and a plurality of said holes belonging to a second group which are different from each other in intensity of secondary electrons generated from surfaces of said holes by irradiation with said charged particles even when there occurs no opening failure, and said step (c) includes the steps of:
- (c-1) grouping said plurality of holes included in said at least one specified small region into said holes belonging to said first group and said holes belonging to said second group;
- (c-2) inspecting whether or not there occurs said opening failure in said holes belonging to said first group; and
- (c-3) inspecting whether or not there occurs said opening failure in said holes belonging to said second group, said step (c-3) being separately performed from said step (c-2).

10. An apparatus for inspecting a semiconductor device, comprising:
- a stage on which one of semiconductor wafers each provided with a plurality of holes is mounted as a semiconductor wafer under inspection;
- a charged-particle irradiation unit for irradiating one of inspection regions with charged particles, said inspection regions being small regions obtained by sectioning a wafer surface of said semiconductor wafer under inspection into a plurality of regions;
- a failure judgment unit for judging whether or not there occurs an opening failure in said holes inside each of said small regions by observing a secondary electron image obtained by irradiation with said charged particles;
- a control unit for relatively moving said charged-particle irradiation unit and said stage on a basis of positional data on a specified small region which is more likely to have said opening failure than the others of said small regions in said wafer surface so that said specified small region is irradiated with said charged particles; and
- an inspection-region determination unit for identifying said specified small region on the basis of design data on said semiconductor wafer under inspection.

11. An apparatus for inspecting a semiconductor device, comprising:
- a stage on which one of semiconductor wafers each provided with a plurality of holes is mounted as a semiconductor wafer under inspection;
- a charged-particle irradiation unit for irradiating one of inspection regions with charged particles, said inspection regions being small regions obtained by sectioning a wafer surface of said semiconductor wafer under inspection into a plurality of regions;
- a failure judgment unit for judging whether or not there occurs an opening failure in said holes inside each of said small regions by observing a secondary electron image obtained by irradiation with said charged particles;

a control unit for relatively moving said charged-particle irradiation unit and said stage on a basis of positional data on a specified small region which is more likely to have said opening failure than the others of said small regions in said wafer surface so that said specified small region is irradiated with said charged particles; and an inspection-region determination unit for identifying a specified region in said wafer surface, which is likely to have a defect, on the basis of a defective distribution in said wafer surface obtained on a plurality of products already manufactured by using chips obtained from other said semiconductor wafers having the same structure as said semiconductor wafer under inspection, to determine said small region corresponding to said specified region as said specified small region.

12. An apparatus for inspecting a semiconductor device, comprising:

a stage on which one of semiconductor wafers each provided with a plurality of holes is mounted as a semiconductor wafer under inspection;

a charged-particle irradiation unit for irradiating one of inspection regions with charged particles, said inspection regions being small regions obtained by sectioning a wafer surface of said semiconductor wafer under inspection into a plurality of regions;

a failure judgment unit for judging whether or not there occurs an opening failure in said boles inside each of said small regions by observing a secondary electron image obtained by irradiation with said charged particles;

a control unit for relatively moving said charged-particle irradiation unit and said stage on a basis of positional data on a specified small region which is more likely to have said opening failure than the others of said small regions in said wafer surface so that said specified small region is irradiated with said charged particles; and a database storing inspection results on other semiconductor wafers having a same structure as said semiconductor wafer under inspection obtained by using said apparatus for inspection, which can be referred to by said control unit.

13. An apparatus for inspecting a semiconductor device, comprising:

a stage on which one of semiconductor wafers each provided with a plurality of holes is mounted as a semiconductor wafer under inspection;

a charged-particle irradiation unit for irradiating one of inspection regions with charged particles, said inspection regions being small regions obtained by sectioning a wafer surface of said semiconductor wafer under inspection into a plurality of regions;

a failure judgment unit for judging whether or not there occurs an opening failure in said holes inside each of said small regions by observing a secondary electron image obtained by irradiation with said charged particles;

a control unit for relatively moving said charged-particle irradiation unit and said stage on a basis of positional data on a specified small region which is more likely to have said opening failure than the others of said small regions in said wafer surface so that said specified small region is irradiated with said charged particles,
wherein said plurality of holes include a plurality of said holes belonging to a first group and a plurality of said holes belonging to a second group which are different from each other in intensity of secondary electrons generated from surfaces of said holes by irradiation with said charged particles even when there occurs no opening failure, and said failure judgment unit has a hole grouping unit for grouping said plurality of holes included in said specified small region into said holes belonging to said first group and said holes belonging to said second group.

* * * * *